United States Patent [19]
Toch et al.

[11] Patent Number: 5,234,484
[45] Date of Patent: Aug. 10, 1993

[54] METHOD FOR ANNEALING PHOSPHORS APPLIED TO SURFACES HAVING MELTING POINTS BELOW THE ANNEALING TEMPERATURE OF THE PHOSPHOR

[75] Inventors: Peter L. Toch; Nils I. Thomas, both of Roanoke; Thomas E. Sisneros, Salem, all of Va.; James Kane, Lawrenceville, N.J.

[73] Assignee: ITT Corporation, New York, N.Y.

[21] Appl. No.: 840,392

[22] Filed: Feb. 24, 1992

[51] Int. Cl.⁵ .............. C03B 25/00; B05D 5/06; F27B 5/14
[52] U.S. Cl. ............... 65/117; 427/545; 427/544; 427/558; 427/559; 392/416; 392/418; 219/405; 219/411
[58] Field of Search ........... 427/545, 543, 544, 553, 427/554, 557, 559, 558, 64; 252/301.4 R, 301.4 S, 301.4 P, 301.6 S; 65/117, 60.7, 60.5; 392/416, 418; 219/405, 411; 118/725

[56] References Cited

U.S. PATENT DOCUMENTS

| | | | |
|---|---|---|---|
| 3,129,108 | 4/1964 | Katona | 427/545 |
| 3,623,996 | 11/1971 | Amster | 252/301.4 S |
| 3,639,254 | 2/1972 | Peters | 252/301.4 S |
| 3,655,575 | 4/1972 | Faria et al. | 252/601.6 S |
| 3,742,277 | 6/1973 | Peters | 252/301.4 S |
| 3,767,459 | 10/1973 | Kingsley et al. | 252/301.6 S |
| 3,894,164 | 7/1975 | Dismukes et al. | 252/301.4 S |
| 4,208,299 | 6/1980 | Oikawa et al. | 252/301.6 S |
| 4,272,397 | 6/1981 | Fukuda et al. | 252/301.6 S |
| 4,311,487 | 1/1982 | Luckey et al. | 252/301.4 H |
| 4,427,723 | 1/1984 | Swain | 427/554 |
| 4,499,005 | 2/1985 | McColl et al. | 252/301.6 S |
| 4,725,344 | 2/1988 | Yocum et al. | 252/301.4 S |
| 4,741,928 | 5/1988 | Wilson et al. | 427/250 |
| 4,755,654 | 7/1988 | Crowley et al. | 392/416 |
| 4,820,906 | 4/1989 | Stultz | 219/405 |
| 4,835,398 | 5/1989 | Nakamura | 252/301.4 H |
| 4,900,584 | 2/1990 | Tuenge et al. | 427/64 |
| 4,931,424 | 6/1990 | Henty | 427/554 |
| 4,958,592 | 9/1990 | Anthony et al. | 392/416 |
| 5,073,698 | 12/1991 | Stultz | 427/557 |

FOREIGN PATENT DOCUMENTS

| | | | |
|---|---|---|---|
| 3322236 | 1/1985 | Fed. Rep. of Germany | 392/416 |
| 61-289967 | 12/1986 | Japan | 392/416 |
| 64-27773 | 1/1989 | Japan | 392/416 |
| 2083728 | 3/1982 | United Kingdom | 392/416 |

*Primary Examiner*—W. Gary Jones
*Assistant Examiner*—Steven P. Griffin
*Attorney, Agent, or Firm*—Arthur L. Plevy; Patrick M. Hogan

[57] ABSTRACT

A method for annealing a deposited material on a substrate structure, where the annealing temperature of the deposited material is greater than the melting temperature of the substrate structure, including the step of inserting the substrate structure into an oven preheated to a temperature above the annealing temperature. The substrate structure is kept in the oven for a time interval wherein the mean temperature of the deposited material is above the annealing temperature and the mean temperature of the substrate structure is below its melting temperature. The substrate structure may be actively cooled while in the oven, thus increasing the time interval the mean temperature of the deposited material can be maintained above the annealing temperature.

20 Claims, 3 Drawing Sheets

METHOD FOR ANNEALING PHOSPHORS APPLIED TO SURFACES HAVING MELTING POINTS BELOW THE ANNEALING TEMPERATURE OF THE PHOSPHOR

FIELD OF THE INVENTION

The present invention relates to a method for annealing an applied phosphor layer and, in particular, to methods for annealing a phosphor layer applied to a surface that has a melting point below the temperature needed to anneal the phosphor.

BACKGROUND OF THE INVENTION

Phosphors are a class of materials that absorb incident electrical or electromagnetic energy and reradiate electromagnetic energy. The output electromagnetic radiation of the phosphor is usually in the visible range of the electromagnetic spectrum, although phosphors that reradiate in the infrared or ultra-violet range can also be produced. A critical manufacturing step for increasing the performance characteristics of phosphor materials, is that the phosphor must be annealed at high temperatures prior to use. Most phosphor materials require an annealing temperature of at least 900° C.

In industries such as semiconductor manufacturing, rapid thermal annealing (RTA) or rapid thermal processing (RTP) technology is widely used to anneal. To anneal silicon wafers, the wafers are positioned under flashlamps and heated to temperatures of 1250° C., in time frames of less than ninety seconds. In such an application, the silicon wafer is rapidly heated to about 900° C.-1100° C., and soaked at that temperature. Finally the heat source is removed and the silicon wafer is allowed to return to room temperature. Silicon has a melting point of 1410° C.; as such the silicon wafer never reaches its melting point as it is annealed.

Similarly, RTP has been used to anneal zinc sulfide based electroluminescent phosphors deposited on high temperature glass substrates. Zinc sulfide electroluminescent phosphors will anneal at temperatures of approximately 550° C. As such, a glass substrate having a stress relief point at 625° C. is used. Again, the annealing temperature is held well below the stress relief point of the phosphor substrate, and the melting point of the glass substrate is not exceeded during the annealing process.

When certain phosphors, such as cathodoluminescent (CRT) phosphors, are applied to low temperature substrates, such as fiber optic windows, manufacturing problems occur. In such applications the annealing point of the cathodoluminescent phosphor is well above the melting point of the substrate. Cathodoluminescent phosphors have an annealing temperature that is well above the temperature at which the fiber optics and other low temperature glasses plasticize. When annealing cathodoluminescent phosphors on such low temperature glasses, the temperature of the substrate glass cannot be elevated to the phosphor annealing temperature without being damaged. In such an application, RTA and RTP manufacturing techniques necessitate a compromise in either the annealing of the phosphor, the integrity of the substrate, or both, since both the phosphor and the substrate cannot be conventionally heated to the needed annealing temperature.

It is therefore a primary object of the present invention method to anneal phosphor materials when applied to substrates having melting points below the annealing temperature of the phosphor without compromising the annealing of the phosphor or the integrity of the substrate.

SUMMARY OF THE INVENTION

The present invention method provides a process of manufacture wherein a phosphor material that has been deposited on a suitable substrate structure can be annealed without damaging the substrate. More specifically, the method includes heating the surface of the substrate structure, on which the phosphor material has been deposited, to a predetermined temperature above the annealing temperature of the phosphor material. The predetermined temperature is maintained at least until the heat from the interfacial surface of the substrate structure conducts through the phosphor material elevating the temperature of all the phosphor material to a temperature sufficient to anneal the phosphor.

Phosphor material is often deposited on substrate structures such as fiber optic devices that plasticize at temperatures lower than the annealing temperature of the phosphor material. To anneal the phosphor material on such surfaces, the energy used to heat the interfacial surface is frequency adjusted to match the absorptive bands of the first several microns of the substrate structure. With such an adjusted heat source only the region of the substrate structure immediately proximate the phosphor material is directly heated. The remaining surfaces of the substrate structure are shielded from the heat source and the substrate structure below the heated surface is cooled. The objective is to anneal a phosphor which has been deposited on a low temperature substrate such as a fiber optic without destroying the substrate. Any damage to the heated region of the substrate structure, caused by the high temperature, is negligible to the overall integrity of the substrate structure because the size of the compromised region is kept very small in relation to the overall size of the substrate structure.

BRIEF DESCRIPTION OF THE FIGURES

For a better understanding of the present invention, reference is made to the following description of an exemplary embodiment thereof, considered in conjunction with the accompanying drawings, in which.

DETAILED DESCRIPTION OF THE INVENTION

Although the present invention method may be used to anneal phosphor materials deposited on any surface, it is especially suitable for use in annealing a phosphor material deposited on surfaces that plasticize at a temperature below the annealing temperature of the phosphor material. Accordingly, the present invention will be described in connection with annealing a phosphor material on a fiber optic structure, wherein the fiber optic structure will plasticize at a temperature below that of the phosphor annealing temperature.

Figure 1:
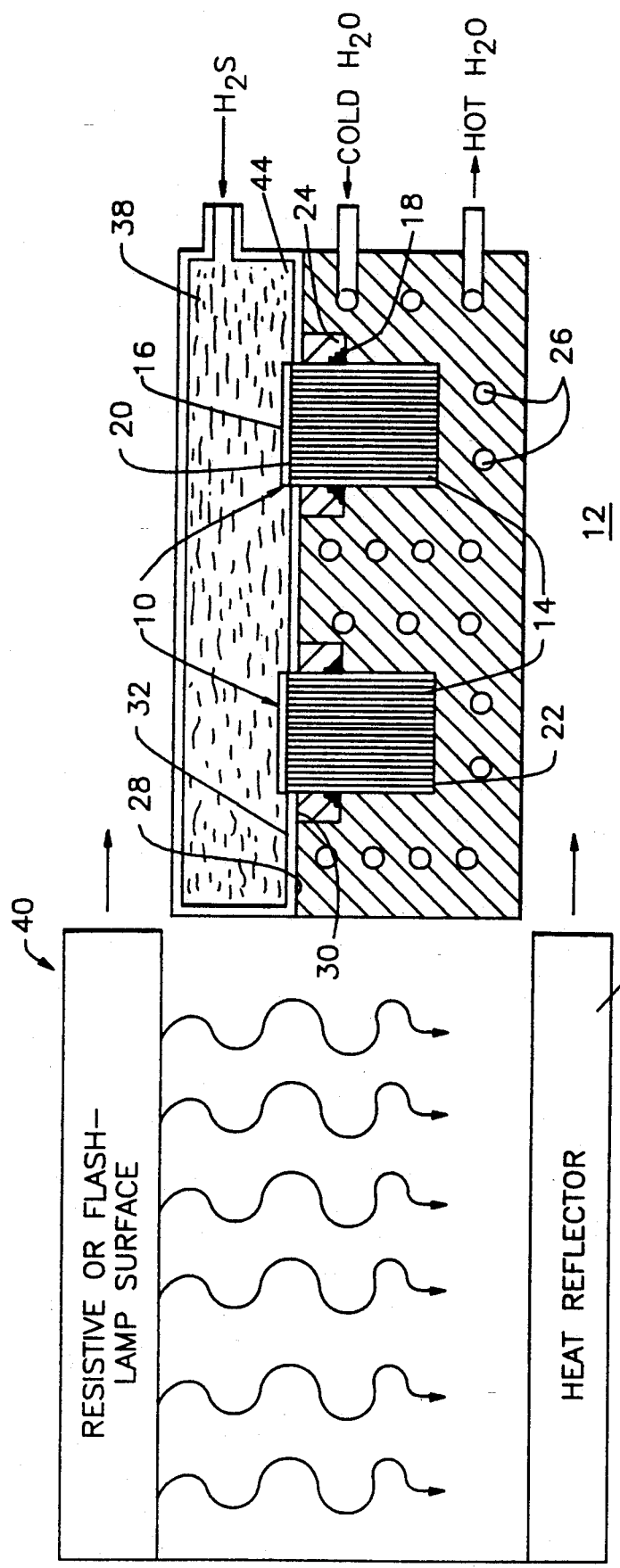
FIG. 1 is a side view of a fiber optic support for holding and cooling a phosphor coated fiber optic substrate in an annealing oven and a block diagram representation of the annealing oven, said fiber optic support including two fiber optic devices and being selectively sectioned and fragmented to facilitate consideration and discussion.

Referring to FIG. 1 there is shown two fiber optic structures 10, held within a base support 12. Each fiber optic structure 10 is comprised of a plurality of fiber optic elements 14 having one end coated with a layer of phosphor material 16. The phosphor material 16 being deposited on the fiber optic elements 14 utilizing vapor deposition or other well known techniques. Essentially there are many acceptable methods of depositing a phosphor on a fiber which maintain the phosphor stoichiometry such as evaporation, sputtering or chemical vapor deposition. Phosphor coated fiber optic structures 10 are commonplace and are often used in image intensifiers and other cathodoluminescent applications. When used in such applications, fiber optic structures are often manufactured with a fritted flange 18. The fritted flange 18 helping in the mounting of the fiber optic structure 10 into a larger device.

The frit material used to create the fritted flange 18 has a relatively low yield temperature, commonly used materials devitrifying at approximately 532° C. Similarly, the fiber optic elements 14 used in forming the fiber optic structure 10 can also have a relatively low temperature at which the fiber optic material yields. For example, if the fiber optic structure 10 were formed from Schott TM invertor fiber optics, the individual fiber optic elements 14 would have a stress relief point around 565° C. In such a construction the fiber optic structure 10 could be heated only to 620° C. for 30 minutes before the optic stress of the fiber optic element 14 relieves. When the optic stress relieves the fiber optic structure may literally "unwind"; other optical substrate materials suffer different forms of deformation when they stress relieve.

If a sulfide phosphor material 16 were used to coat the fiber optic structure 10, the phosphor material 16 can have an annealing temperature in excess of 900° C. The phosphor material 16 is on the order of 300° C.–400° C. higher than the yield temperatures of the fiber optic elements 14 and the fritted flange 18.

The fiber optic structures 10 are held within a base support 12. The base support 12 is formed with receptacles 22 shaped to retain the fiber optic structures 10. Although only two receptacles 22 and two fiber optic structures 10 are shown as part of the base support 12, it should be understood that other numbers can be accommodated. In the method shown, the fiber optic structures 10 are cylindrical having the fritted flange 18 extending from the circumferential surface. The receptacles 22 formed in the base support 12 are shaped so as to accept the lower part of the fiber optic structure 10, opposite the phosphor material 16, below the fritted flange 18. The walls of the receptacles 22 contact the edges of the fiber optic structure in a thermally conductive manner. Annular collar members 24 are placed around the fiber optic structure 10 above the fritted flange 18. The collar members 24 are shaped so as to intimately contact both the contours of the fritted flange 18 and the portion of the fiber optic structure 10 above the fritted flange 18. Once placed into the receptacle 22 and surrounded by the collar member 24, all surfaces of fiber optic structure 10, except for the surface coated by the phosphor material 16, are thermally coupled to the base support 12.

The base support 12 is formed from a highly thermally conductive material so as to absorb heat from the fiber optic structures 10. As such, the base support 12 acts as a heat sink for the various fiber optic structures 10 held within the base support 12. The base support may be actively cooled with a heat exchanger such as a serpentine configuration of water radiator lines 26 directed through the base support 12 and to cool the support.

The top surface 28 of the base support 12 and the top surface 30 of the collar member 24 are covered with a heat reflective shield 32 capable of reflecting heat energy from the annealing oven 40. As such, when the fiber optic devices 10 are present in the base support 12, only the phosphor material 16 on the fiber optic structure 10 is left unprotected by the heat reflective shield 32.

The environment above the base support 12 is encapsulated within a chamber 38 made of selectively transparent material 42 such as quartz tube. The chamber 38 is filled with a gas 44 such as hydrogen sulfide, chlorine or a like relative atmosphere that will react with the phosphor material 16 during annealing, enhancing the reradiation characteristics of the phosphor material 16. For sulfide phosphors the output brightness of the phosphor is increased if annealing takes place in a hydrogen sulfide atmosphere. For non-sulfide phosphors such as lanthanum-oxychloride, chlorine gas is employed.

Once the fiber optic structures 10 are properly positioned within the base support 12, the phosphor material 16 on the fiber optic elements 14 is annealed by positioning the base support 12 within an annealing oven 40. The annealing oven 40 may include any heat source but is preferably constructed as a conventional resistive heated furnace or flash lamp rapid thermal anneal furnace. In such embodiments the annealing oven 40 is maintained at a temperature by positioning a heat reflector 41 under the heat source that reflects heat energy back into the center of the annealing oven. To anneal the phosphor material 16, the phosphor material 16 must be heated above its annealing temperature (about 900° C.) for an experimentally determined period of time; depending on the type, size and shape of the phosphor material 16. However, the temperature at which the underlying fiber optic elements 14 yields, is about 600° C. and the temperature at which the fritted flange yields is about 530° C. As such, the temperature of these components cannot be elevated to the annealing temperature of the phosphor material 16 without a compromise in integrity.

To anneal the phosphor material 16 without damaging the underlying fiber optic elements 14, the annealing oven 40 is preheated to a temperature above the annealing temperature of the phosphor material 16. Most phosphors are substantially transparent to both visible and infrared radiation. As such, the phosphor material 16 itself cannot be efficiently heated by the radiated heat of the annealing oven 40. Consequently, if a classical rapid thermal anneal furnace is being used as the heat source, the flash lamp of the furnace is color temperature adjusted at a frequency that is absorbed by the first several microns of the top surface 20 of the fiber optic elements 14 on which the phosphor material is deposited. The surface 20 of the fiber optic elements 14 heat to a temperature above the annealing temperature of the phosphor material 16. The temperature of the top surface 20 is maintained until the heat is conducted through the adjoining phosphor material 16 and the phosphor material 16 is annealed. Similarly, if the annealing oven 40 is heated through a resistive element, the selectively transparent material 42 forming the gas chamber 38 would be fabricated from a material such as quartz that would radiate energy toward the phosphor material 16 at a frequency that matched the absorptive bands of the first several microns of the below lying fiber optic elements 14. Again, the top surface 20 of the fiber optic elements 14 would heat and the heat would be conducted into the phosphor material 16 causing it to anneal.

The radiated energy from the annealing oven 40 passes through the phosphor material 16 causing the first few microns of the fiber optic elements 14 to heat. The reflective shielding 32 covering the base support 12, prevents the base support 12 from directly absorbing energy from the annealing oven 40, and prevents the side surfaces of the fiber optic devices 10 from absorbing radiated energy. The phosphor material 16 deposited on the fiber optic elements 14 is thinly deposited and has a relatively small mass. Adversely, the fiber optic elements 14 are part of a large structure with a vastly greater mass. As such, even though the top surface 20 of the fiber optic elements 14 are heated to the temperature of the annealing oven, the mean temperature of the phosphor material 16 is elevated at a far greater rate than is the mean temperature of the fiber optic elements 14.

Figure 2:
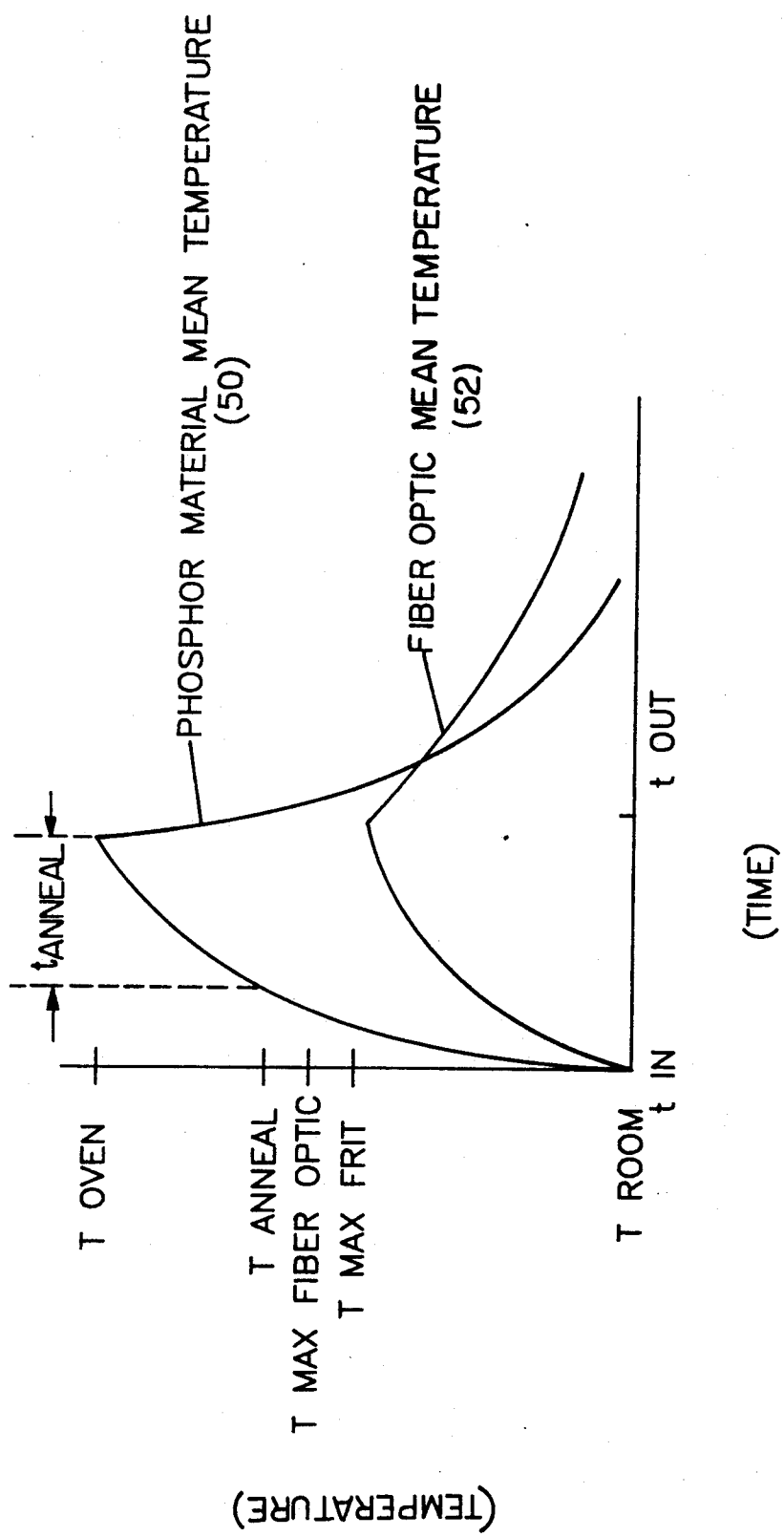
FIG. 2 is a graph plotting the temperature of a phosphor coated fiber optic substrate versus the time said substrate remains in an annealing oven.

Referring to FIG. 2, in conjunction with FIG. 1, it can be seen that before the fiber optic structure 10 is introduced to the annealing oven 40, both the phosphor material 16 and the fiber optic elements 14 are at room temperature (T room). The annealing oven 40 is preheated at a predetermined temperature (T oven) that is above the annealing temperature (T anneal) for the phosphor material 16. The fiber optic structure 10 is then rapidly introduced into the annealing oven 40 at time interval (t in). Once within the annealing oven 40 the top surface 20 of the fiber optic elements 14 quickly heats conducting heat to both the phosphor material 16 and the remaining mass of the fiber optic elements 14. Since the mass of phosphor material 16 is small compared to the mass of the fiber optic elements 14, the mean temperature 50 of the phosphor material 16 increases far more rapidly than the mean temperature 52 of the fiber optic elements 14. As a result, the mean temperature 50 of the phosphor material 16 quickly rises above the anneal temperature (T anneal) and the heat annealing of the phosphor material 16 begins.

As the mean temperature 50 of the phosphor material 50 elevates, the mean temperature of the fiber optic elements 14 also elevates, but at a slower rate. Eventually, the mean temperature 52 of the fiber optic elements 14 approaches the maximum temperature (T frit) for the fritted flange 18 or the maximum temperature (T max) for the fiber optic elements 14 themselves. Prior to the time that these maximum temperatures are reached, the fiber optic structure 10 is removed from the annealing oven 40 (t out) and the temperatures of both the phosphor material 16 and the fiber optic elements 14 decrease rapidly. The time difference (t anneal) between when the mean temperature 50 of the phosphor material exceeds the anneal temperature (T anneal) and the time (t out) when the heat source is removed, is the period in which the annealing of the phosphor material 16 occurs.

It should be understood that many fiber optic materials and frit materials do not yield instantly when subjected to a temperature beyond their point of plasticization. As such it should be understood that the mean temperature 52 of the fiber optic device 10 can be elevated beyond the yield temperatures for the fritted flange 18 and the fiber optic elements 14, for short periods of time in which no devitrification or stress relief occurs. The extent and length at which the fritted flange 18 and fiber optic elements 14 can withstand such elevated temperatures can be determined for varying constructions.

Figures 3, 4:
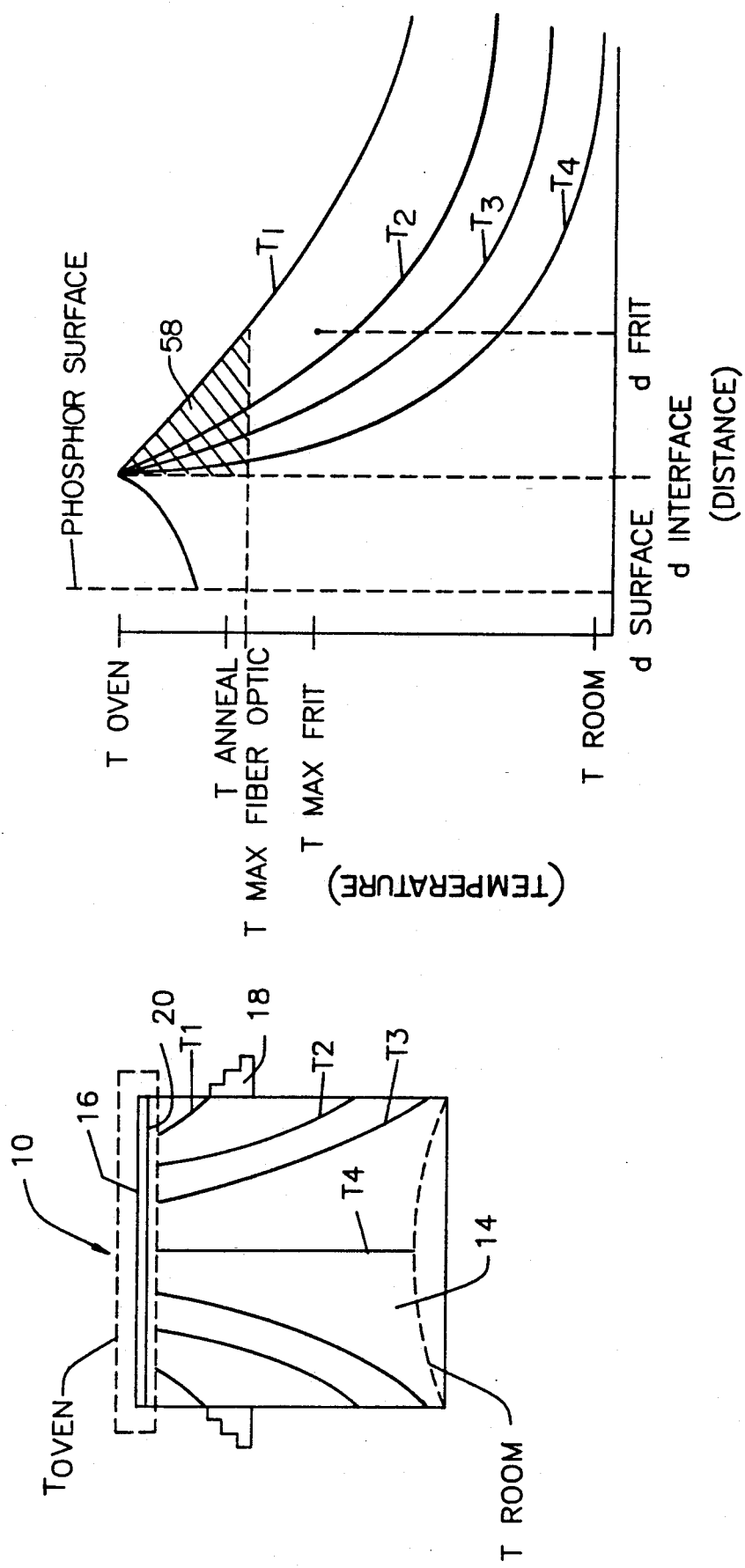
FIG. 3 is a side view of a phosphor coated fiber optic substrate showing the temperature gradients within said substrate while said substrate is within an annealing oven.
FIG. 4 is a graph plotting the temperature gradients depicted in FIG. 3 on a distance versus temperature grid.

Referring to FIGS. 3 and 4, in conjunction with FIGS. 1-2, the temperature gradients controlling the extent of the temperatures and dwell time of the phosphor annealing process are shown. As can be seen, when the fiber optic device 10 is within the annealing oven 40, the radiated energy is absorbed by the top surface 20 of the fiber optic elements 14, heating the top surface 20 of fiber optic elements 14 to the temperature (T oven) of the annealing oven 40. When in the annealing oven 40, the fiber optic device 10 never reaches an equilibrium. Consequently, temperature gradients T1, T2, T3, T4 exist throughout the mass of the fiber optic device 10.

Obviously, since only the top surface 20 of the fiber optics elements 14 is heated, the further the distance from the top surface 20, the cooler the fiber optic elements 14. Similarly, the further the distance in the phosphor material 16 from the top surface 20 of the fiber optic elements 14, the cooler the temperature of the phosphor material. With the type, shape and depth of the phosphor material 16 known in a given application, an oven temperature (T oven) is chosen such that the coolest point (d surface) on the phosphor material 16 is still above the annealing temperature (T anneal), during the annealing period (t anneal) of the heat cycle.

Temperature gradients T1, T2, T3, T4 are calculated or experimentally determined for various constructions of the fiber optic elements 14 and fritted flanges 18. During the heating cycle, it is desirable to have the fritted flange 18 positioned at a depth (d frit) that corresponds to a point on a temperature gradient that is below the devitrification temperature (T frit) of the frit material 18. Similarly, it is desirable to minimize the temperature gradient area 58 that exists above the maximum temperature (T max) of the fiber optic elements 14. By minimizing both the extent of the temperature gradient area 58 and the duration of time in which that temperature gradient area 58 exists, the heat damage to the fiber optic elements 14 can be kept at a negligible level.

Obviously, since the fiber optic elements 14 and fritted flange 18 are both thermally coupled to the base support 12, the heat absorptive characteristics of the base support 12 have a large effect on the temperature gradients T1, T2, T3, T4. If the base support 12 is actively cooled, as is shown, the length of time and high temperature, at which the phosphor material 16 can be annealed, can both be increased without compromise to the underlying fiber optic elements 14.

The preferred composition for the phosphor material is the use of alkaline earth thiogallate phosphors such as a strontium, calcium, barium phosphor. However, as indicated, if the phosphor material 16 were a sulfide phosphor, the output brightness of the phosphor could be increased if the gas chamber 38 above the phosphor material 16 were filled with hydrogen sulfide during annealing. If the phosphor material 16 were a non-sulfide phosphor, such as lanthanum oxy-chloride, chlorine gas can be used. The annealing process, and the presence of the relative atmosphere during the anneal process, act to increase the reradiation characteristics of the phosphor material 16 making a more efficient fiber optic device 10.

It will be understood that the embodiment used to illustrate the present invention method is merely exemplary and that a person skilled in the art may apply the present invention method to many applications without departing from the spirit and scope of the invention. More specifically, it should be recognized that the use of a fiber optic device coated on one end with a phosphor material was exemplary. The present invention method can be used to anneal any material with a high annealing temperature on any substrate that has a melting temperature below that of the annealing temperature. All such modifications and variations are intended to be included within the scope of the invention as defined by the appended claims.

What is claimed is:

1. A method for annealing a deposited material on a substrate structure, wherein said deposited material has an annealing temperature above the melting point of the substrate structure, said method comprising the steps of:
   heating an enclosure to a temperature above said annealing temperature of said deposited material;
   placing said substrate structure, having said deposited material thereon, into a support means, where said support means retains said substrate structure at a set orientation;
   inserting said support means, retaining said substrate structure, into said enclosure;
   withdrawing said substrate structure from said enclosure after a predetermined time interval wherein the mean temperature of said deposited material is above said annealing temperature and the mean temperature of said substrate structure is below said melting point.

2. The method of claim 1, further including the step of selectively shielding said substrate structure to protect specific surfaces of said substrate structure from being exposed to said enclosure upon insertion of said substrate structure into said enclosure.

3. The method of claim 2, further including the step of passing electromagnetic energy through said deposited material on said substrate structure when said substrate structure is said enclosure.

4. The method of claim 3, wherein said deposited material is deposited on a first surface of said substrate structure, wherein the first several microns of said substrate structure below said first surface have predetermined frequency band absorption characteristics and said electromagnetic energy is frequency adjusted to match said frequency band absorption characteristics of said first several microns of said substrate structure.

5. The method of claim 4 wherein said electromagnetic energy originates form at least one lamp.

6. The method of claim 5, wherein a selectively transparent material is placed between said lamp and said deposited material, said selectively transparent one material adjusting said electromagnetic energy to a desired frequency value.

7. The method of claim 3, wherein said electromagnetic energy originates from at least one resistive heating element.

8. The method of claim 7, wherein a selectively transparent material is placed between said resistive heating element and said deposited material, said selectively transparent material adjusting said electromagnetic energy to a desired frequency value.

9. The method according to claim 1 wherein said enclosure is an oven means.

10. The method of claim 1 further including the step of cooling said substrate structure within said support means while said substrate structure and said support means are in said enclosure.

11. The method of claim 10 wherein said substrate structure is thermally coupled to said support means, wherein said support means acts as a heat sink and absorbs heat from said substrate structure.

12. The method of claim 11 wherein said support means is actively cooled by a fluid.

13. The method of claim 10, wherein said support means is shielded from the hat of said enclosure by a reflective shield when said support means is positioned in said enclosure.

14. The method of claim 13, wherein said substrate structure is a fiber optic device.

15. The method of claim 14 wherein said fiber optic device includes a fritted component wherein said step of withdrawing said substrate structure from said enclosure is implemented at a time when said mean temperature of said phosphor is above said annealing temperature and the temperature of said fritted component is below a point of devitrification.

16. The method of claim 1 wherein said deposited material is a phosphor.

17. The method of claim 16 further including the step of exposing said phosphor to a reactive atmosphere while said substrate structure is in said enclosure.

18. The method of claim 17 wherein said phosphor includes a sulfide phosphor and said reactive atmosphere includes hydrogen sulfide.

19. The method of claim 16 wherein said phosphor includes a strontium thiogallate phosphor.

20. The method of claim 17, wherein said phosphor includes a non-sulfide phosphor and said reactive atmosphere includes a chlorine gas.

* * * * *